US006538511B2

(12) United States Patent
Tesch

(10) Patent No.: US 6,538,511 B2
(45) Date of Patent: Mar. 25, 2003

(54) OPERATIONAL AMPLIFIER INCLUDING A RIGHT-HALF PLANE ZERO REDUCTION CIRCUIT AND RELATED METHOD

(75) Inventor: Bruce J. Tesch, Melbourne, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/900,588

(22) Filed: Jul. 6, 2001

(65) Prior Publication Data
US 2002/0153953 A1 Oct. 24, 2002

Related U.S. Application Data
(60) Provisional application No. 60/273,692, filed on Mar. 6, 2001.

(51) Int. Cl.[7] .................................................. H03F 3/45
(52) U.S. Cl. ........................................ 330/253; 330/261
(58) Field of Search ................................ 330/253, 261, 330/292

(56) References Cited

U.S. PATENT DOCUMENTS 4,562,408 A * 12/1985 Nagai et al. ................ 330/253
4,785,258 A * 11/1988 Westwick .................... 330/253
5,479,132 A * 12/1995 Verhaeghe et al. .......... 327/379
5,485,121 A    1/1996 Huijsing et al. ............. 330/260
5,877,654 A    3/1999 Fong et al. .................. 330/292
5,994,960 A * 11/1999 Baschirotto et al. ......... 330/253
6,057,734 A *  5/2000 Xu .............................. 330/261

* cited by examiner

Primary Examiner—Robert Pascal
Assistant Examiner—Khanh Van Nguyen
(74) Attorney, Agent, or Firm—Allen, Dyer, Doppelt, Milbrath & Gilchrist, P.A.

(57) ABSTRACT

An operational amplifier includes at least one bias current generator, a first gain stage connected to the at least one bias current generator and defining inputs for the operational amplifier, and a second gain stage. The second gain stage may be connected to the at least one bias current generator. Moreover, the second gain stage may be driven by the first gain stage and define an output for the operational amplifier. The operational amplifier may further include at least one capacitive element connected between the first gain stage and the output. Additionally, a circuit element having a controllable conductance may be connected between the at least one capacitive element and the first gain stage. A control circuit may also be included for controlling the circuit element so that the conductance thereof substantially matches a transconductance of the second gain stage.

17 Claims, 2 Drawing Sheets

OPERATIONAL AMPLIFIER INCLUDING A RIGHT-HALF PLANE ZERO REDUCTION CIRCUIT AND RELATED METHOD

RELATED APPLICATION

The present application is based upon co-pending provisional application serial No. 60/273,692 filed Mar. 6, 2001, which is hereby incorporated herein in its entirety by reference.

FIELD OF THE INVENTION

The present invention relates to the field of electronic circuits, and, more particularly, to operational amplifiers.

BACKGROUND OF THE INVENTION

Two-stage operational amplifiers typically include a first gain stage connected to inputs of the amplifier and a second gain stage driven by the first gain stage. The second gain stage provides the output of the amplifier. Both the first gain stage and the second gain stage are operated at respective bias currents. In metal oxide semiconductor (MOS) amplifiers, the first gain stage is typically operated at bias currents which are comparable in magnitude to the bias currents of the second gain stage so that maximum gain and bandwidth may be achieved.

Different capacitances may be present at the control input and the output of the second gain stage causing respective input and output poles. A well known method for addressing this problem is to connect a so-called Miller capacitor between the control input and the output of the second gain stage to "split" these poles. A drawback of this approach is that at high frequency currents the Miller capacitor acts as a short circuit between the control input and the output of the second gain stage, which causes a feedthrough effect.

While the feedthrough effect may be problematic in any two-stage amplifier, it is particularly so in MOS amplifiers. The reason is that a transconductance of the second gain stage varies as the square root of the bias current rather than directly with the bias current, which is the case with a bipolar amplifier. The feedthrough effect may therefore result in the occurrence of a right-half plane (RHP) zero in the complex transfer function of the amplifier. This, in turn, may severely degrade the phase margin of the amplifier.

Several prior art attempts have been made to reduce the feedthrough effect caused by a Miller capacitor. One such approach is to insert a nulling resistor in series between the first gain stage and the Miller capacitor. If the nulling resistor is made equal in value to the inverse of the transconductance of the second gain stage, the alternating current (AC) flowing through the nulling resistor will cancel the RHP zero as a result of the elimination of the feedthrough effect for a particular transconductance. Of course, the transconductance of the second gain stage is quite often not a constant. Thus, the nulling resistor does not "track" the transconductance of the second gain stage well. In other words, the nulling resistor approach may only be relied upon to provide adequate compensation at one particular bias current, temperature, and set of process variations of the integrated circuit.

Yet another common prior art approach is the so-called "source-follower" approach in which the Miller capacitor is connected between the first gain stage and a first conduction terminal of a transistor. The other conduction terminal of the transistor is connected to a reference voltage, and the conduction terminal of the transistor is connected to the output of the second gain stage. Thus, the source-follower transistor drives the compensation capacitor based upon the output of the second gain stage. Here again, this approach may still provide poor tracking of the transconductance of the second gain stage over a wide dynamic range. It may even be worse than a nulling resistor in certain applications. In particular, this approach is disadvantageous in that it is unidirectional. The signal flow is from the output of the second gain stage through the source-follower transistor to the Miller capacitor. Signal flow in the opposite direction is prevented by the source-follower transistor.

Still other prior art approaches are discussed in U.S. Pat. No. 5,485,121 to Huijsing et al. entitled "Amplifier Arrangement with Multipath Miller Zero Cancellation." It is noted in the background of the patent that one such approach is to insert a unilateral element in the Miller capacitor branch to suppress direct feedthrough at high frequencies. More specifically, the unilateral element may be a gate transistor connected in series with the Miller capacitor to serve as a current buffer. That is, the gate of this transistor is connected directly to ground. The patent notes that a disadvantage of this approach is that it introduces an active element and its associated poles in the Miller feedback path. It is further stated that "[t]hese poles deteriorate the high frequency performance and the remedy is worse than the disease." In particular, this approach results in a large variation in resistance ($g_{DS}$) with supply voltage variations.

The patent itself discloses a circuit which includes an additional current source coupled to the output of the second gain stage. This additional current source provides a current that is substantially in phase opposition to the bias current of the second gain stage. Of course, this approach requires a separate and dedicated current source, which may increase both power consumption and space requirements.

SUMMARY OF THE INVENTION

In view of the foregoing background, it is therefore an object of the invention to provide an operational amplifier which significantly reduces the RHP zero under varying supply voltages, temperatures, and fabrication process parameters.

This and other objects, features, and advantages in accordance with the present invention are provided by an operational amplifier including at least one bias current generator, a first gain stage connected to the at least one bias current generator, and a second gain stage connected to the at least one bias current generator. The second gain stage may be driven by the first gain stage. The operational amplifier may further include at least one capacitive element connected between the first gain stage and the output from the second gain stage. Additionally, a circuit element having a controllable conductance may be connected between the at least one capacitive element and the first gain stage. Also, a control circuit may be included for driving the circuit element so that the conductance thereof substantially matches a transconductance of the second gain stage. Accordingly, occurrences of a right half plane (RHP) zero at the output from the second gain stage is significantly reduced.

More specifically, the circuit element may be a transistor having a first conduction terminal connected to the first gain stage, a second conduction terminal connected to the at least one capacitive element, and a control terminal connected to the control circuit. For example, the transistor may be an N-channel metal oxide semiconductor (NMOS) transistor. The control circuit may include first and second diode-connected transistors connected in series between the at least one bias current generator and a voltage reference. Moreover, the first and second diode-connected transistors may also be NMOS transistors.

Furthermore, the at least one capacitive element may be a transistor having first and second conduction terminals connected together and to the first gain stage and a control terminal connected to the output. Additionally, the operational amplifier may be a complementary metal oxide semiconductor (CMOS) operational amplifier.

A method aspect of the invention is for reducing a right half plane (RHP) zero at an output of an operational amplifier. The amplifier may include first and second signal inputs, at least one bias current generator, a first gain stage connected to the first and second inputs and the at least one bias current generator, and a second gain stage connected to the output and the at least one bias current generator. The second gain stage may be driven by the first gain stage, and at least one capacitive element may be connected between the first gain stage and the output. The method may include connecting a circuit element having a controllable conductance between the at least one capacitive element and the first gain stage. Furthermore, the circuit element may be driven so that the conductance thereof substantially matches a transconductance of the second gain stage to thereby significantly reduce the RHP zero.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
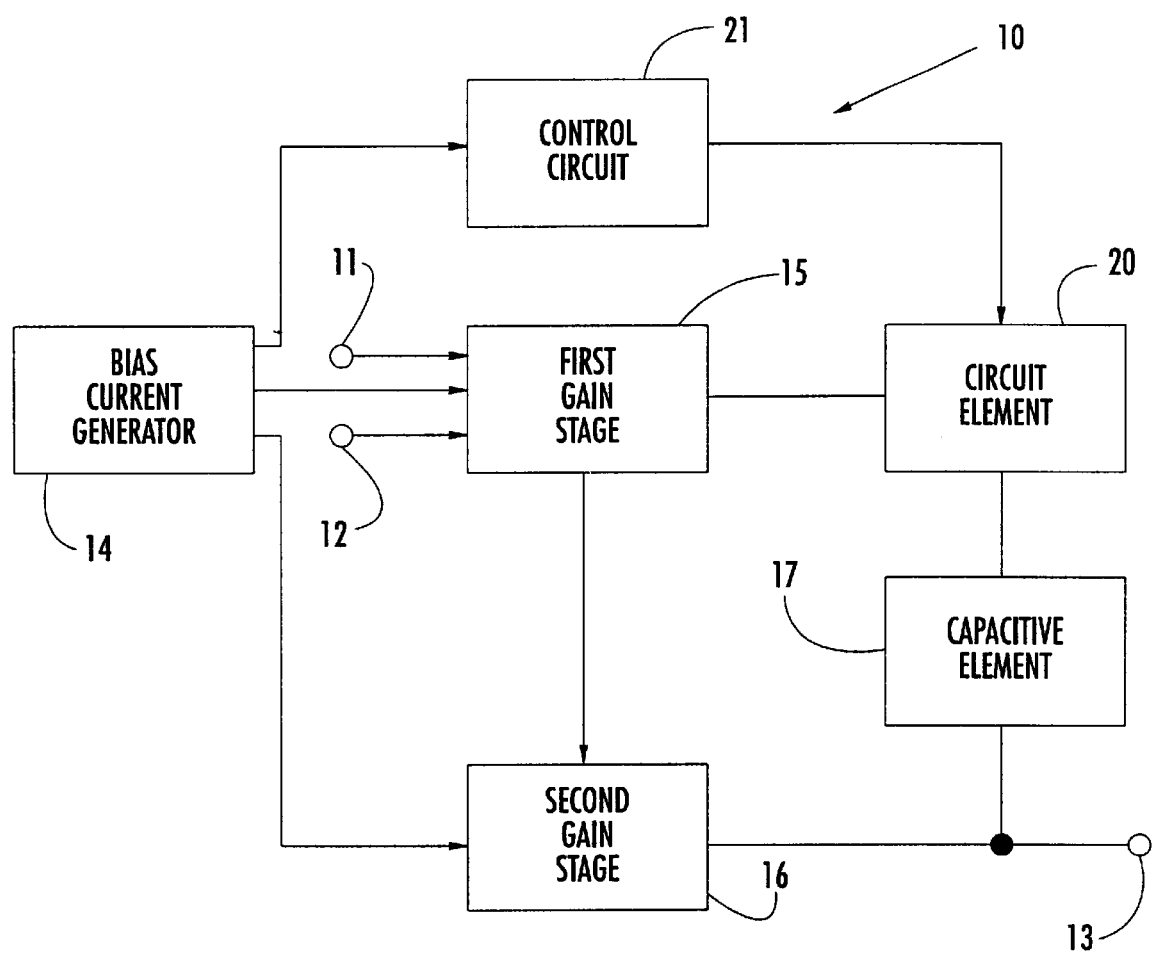
FIG. 1 is a schematic block diagram of an operational amplifier including a RHP reduction circuit according to the invention.
Figure 2:
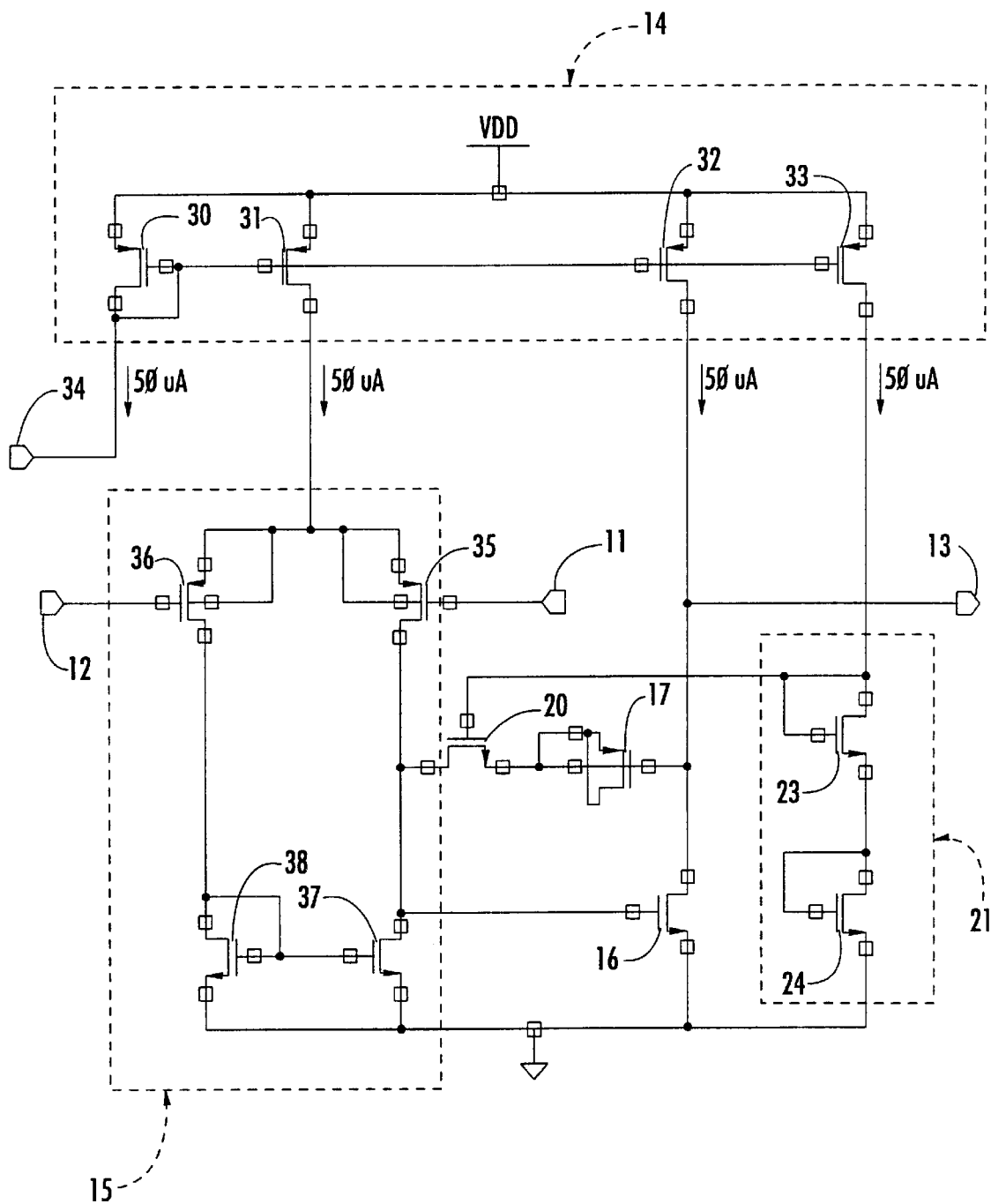
FIG. 2 is a more detailed schematic diagram of an embodiment of the operational amplifier of FIG. 1.

Referring to FIGS. 1 and 2, an operational amplifier 10 according to the invention is now described. The operational amplifier 10 includes at least one bias current generator 14 and a first gain stage 15 connected to the bias current generator. The first gain stage 15 defines inputs 11, 12 of the amplifier 10. A second gain stage 16 is connected to the bias current generator 14 and defines an output 13 for the amplifier 10. The second gain stage 16 is driven by the first gain stage 15.

A Miller capacitive element 17 may be connected between the first gain stage 15 and the output 13. Of course, those skilled in the art will appreciate that the capacitive element 17 may include one or more capacitors, for example. Furthermore, in the embodiment shown in FIG. 2, the amplifier 10 is implemented using complementary metal oxide semiconductor (CMOS) technology. The capacitive element 17 may therefore be implemented using a P-channel MOS (PMOS) transistor, for example. That is, the PMOS transistor 17 has first and second conduction terminals connected together and to the first gain stage 15, and a control terminal connected to the output 13.

According to the invention, a circuit element 20 having a controllable drain-source conductance is connected between the capacitive element 17 and the first gain stage 15. A control circuit 21, which is connected to the bias current generator 14, controls the circuit element 20 so that the drain-source conductance thereof substantially matches a transconductance of the second gain stage 16, as will be discussed in further detail below. Those of skill in the art will therefore appreciate that the operational amplifier 10 according to the invention may maintain a substantially constant phase margin between the control input and output of the second gain stage 16.

More particularly, the circuit element 20 may be a transistor having a first conduction terminal connected to the first gain stage 15, a second conduction terminal connected to the transistor 17 (i.e., the capacitive element), and a control terminal connected to the control circuit 21, as shown in FIG. 2. The transistor 20 acts as a resistor and thus tracks the transistor 16 (i.e., the second gain stage) very well, as will be appreciated by those of skill in the art. In the CMOS embodiment illustrated in FIG. 2, the transistor 20 is an N-channel MOS (NMOS) transistor. Furthermore, the control circuit 21 may include first and second diode-connected transistors 23, 24 connected in series between the bias current generator 14 and ground. Those of skill in the art will appreciate that the term "diode-connected" as used herein simply means that the transistors 23, 24 have their respective gates and drains connected together, not that they function as diodes. The first and second diode-connected transistors 23, 24 may also be NMOS transistors, as seen in FIG. 2.

Of course, those of skill in the art will appreciate that many different design variations are possible and that the above transistors may be of an opposite polarity for different implementations. Furthermore, the operational amplifier according to the invention need not be implemented using CMOS technology. For example, certain of the above elements may be bipolar elements, as will be appreciated by those of skill in the art.

As noted above, the control circuit 21 drives the circuit element 20 so that the drain-source conductance thereof substantially matches a transconductance of the second gain stage 16. More specifically, the transconductance of the transistor 16 is given by the following equation:

$$g_{m16} = \sqrt{2k'I_D \frac{W}{L}}, \quad (1)$$

where k' is a device constant, $I_D$ is the drain current, W is the channel width of the transistor, and L is the channel length of the transistor. Moreover, the drain-source conductance of the transistor 20 is:

$$g_{DS20} = \frac{W}{L}k'(V_{GS} - V_T)|_{V_{DS}=0}, \quad (2)$$

where $V_{GS}$ is the gate-source voltage for the transistor, $V_T$ is the threshold voltage, and $V_{DS}$ is the drain-source voltage. As will be appreciated by those skilled in the art, $V_{DS}$ will be substantially equal to zero since the capacitive element 17 blocks current flow in the circuit element 20.

To cancel the right-half plane zero, the equations (1) and (2) should be equal under all conditions. That is, $$\left(2k'I_D\frac{W}{L}\right)^{1/2} = k'\frac{W}{L}(V_{GS} - V_T). \quad (3)$$

Substituting for $I_D$ where $$I_D = \frac{k'}{2}\frac{W}{L}(V_{GS} - V_T)^2, \text{ then} \quad (4)$$

$$\left(2k'\frac{W}{L}\frac{k'}{2}\frac{W}{L}(V_{GS} - V_T)^2\right)^{1/2} = k'\frac{W}{L}(V_{GS} - V_T), \quad (5)$$

Thus, $$k'\frac{W}{L}(V_{GS} - V_T) = k'\frac{W}{L}(V_{GS} - V_T). \quad (6)$$

By selecting the transistors 16, 20 such that k', W/L, and $V_{GS}$-$V_T$ are the same, $g_{m16}$ and $g_{DS20}$ will therefore be equal. Simulations have confirmed this fact over process, temperature and bias current variations. The reduction of the RHP zero may be observed in the open-loop response of the operational amplifier 10, as will be appreciated by those of skill in the art.

Turning again to the CMOS embodiment illustrated in FIG. 2, the bias current generator 14 may include PMOS transistors 30–33 each connected by respective first conduction terminals to a voltage reference VDD. The respective control terminals of the transistors 30–33 are each connected to an input 34. Moreover, the second conduction terminal of the transistor 30 is connected to the input 34, the second conduction terminal of the transistor 31 is connected to the first gain stage 15, the second conduction terminal of the transistor 32 is connected to the output 13 and transistor 16, and the second conduction terminal of the transistor 33 is connected to the control circuit 21.

As noted above, in MOS amplifiers the first gain stage 15 is typically operated at bias currents which are comparable in magnitude to the bias currents of the second gain stage 16. As illustratively shown in FIG. 2, the bias currents for the first gain stage 15 and second gain stage 16 are both approximately 50 μA for this particular embodiment. Of course, different bias currents and/or separate bias current generators may be used, as will be appreciated by those of skill in the art.

Additionally, the first gain stage 15 may include first and second PMOS transistors 35, 36 each respectively connected at their gates to the first and second signal inputs 11, 12. Respective first conduction terminals and bodies of the transistors 35, 36 are connected to the second conduction terminal of the transistor 31 and receive bias current therefrom. The first gain stage also includes NMOS transistors 37, 38 having first conduction terminals respectively connected to the second conduction terminals of transistors 35, 36. The control terminals of the transistors 37, 38 are both connected to the second conduction terminal of the transistor 36. Also, the second conduction terminal s of the transistor s 37, 38 are both connected to ground (or other voltage reference). The output of the first gain stage 15 is provided between the second conduction terminal of the transistor 35 and first conduction terminal of the transistor 37.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An operational amplifier comprising:
    at least one bias current generator;
    a first gain stage connected to said at least one bias current generator and defining inputs for the operational amplifier;
    a second gain stage connected to said at least one bias current generator being driven by said first gain stage and defining an output for the operational amplifier;
    at least one capacitive element connected between said first gain stage and the output:
    a circuit element having a controllable conductance, said circuit element being connected between said at least one capacitive element and said first gain stage; and
    a control circuit for controlling said circuit element so that the controllable conductance thereof substantially matches a transconductance of said second gain stage.

2. The operational amplifier of claim 1 wherein said circuit element comprises a transistor having a first conduction terminal connected to said first gain stage, a second conduction terminal connected to said at least one capacitive element, and a control terminal connected to said control circuit.

3. The operational amplifier of claim 2 wherein said transistor comprises an N-channel metal oxide semiconductor transistor.

4. The operational amplifier of claim 1 wherein said control circuit comprises first and second diode-connected transistors connected in series between said at least one bias current generator and a voltage reference.

5. The operational amplifier of claim 4 wherein said first and second diode-connected transistors comprise N-channel metal oxide semiconductor transistors.

6. The operational amplifier of claim 1 wherein said at least one capacitive element comprises a transistor having first and second conduction terminals connected together.

7. The operational amplifier of claim 1 wherein at least said first gain stage comprises CMOS transistors.

8. A complementary metal oxide semiconductor (CMOS) operational amplifier comprising:
    at least one bias current generator;
    a first gain stage connected to said at least one bias current generator and defining inputs for the operational amplifier;
    a second gain stage connected to said at least one bias current generator being driven by said first gain stage and defining an output for the operational amplifier;
    at least one capacitive element connected between said first gain stage and the output;
    a transistor having a controllable conductance, said transistor being connected between said at least one capacitive element and said first gain stage; and
    a control circuit for controlling said transistor so that the controllable conductance thereof substantially matches a transconductance of said second gain stage.

9. The CMOS operational amplifier of claim 8 wherein said transistor comprises an N-channel metal oxide semiconductor transistor.

10. The CMOS operational amplifier of claim 8 wherein said control circuit comprises first and second diode-connected transistors connected in series between said at least one bias current generator and a voltage reference.

11. The CMOS operational amplifier of claim 10 wherein said first and second diode-connected transistors comprise N-channel metal oxide semiconductor transistors.

12. The CMOS operational amplifier of claim 8 wherein said at least one capacitive element comprises a transistor having first and second conduction terminals connected together.

13. A method for reducing a right half plane (RHP) zero at an output of an operational amplifier comprising at least one bias current generator, a first gain stage connected to the the at least one bias current generator and defining inputs for the operational amplifier, a second gain stage connected to the at least one bias current generator being driven by the first gain stage and defining an output for the operational amplifier, and at least one capacitive element connected between the first gain stage and the output, the method comprising:

connecting a circuit element between the at least one capacitive element and the first gain stage, the circuit element having a controllable conductance; and controlling the circuit element so that the controllable conductance thereof substantially matches a transconductance of the second gain stage to thereby reduce the RHP zero.

14. The method of claim 13 wherein the circuit element comprises a transistor having a first conduction terminal connected to the first gain stage, a second conduction terminal connected to the at least one capacitive element, and a control terminal connected to the control circuit.

15. The method of claim 14 wherein the transistor comprises an N-channel metal oxide semiconductor transistor.

16. The method of claim 13 wherein driving the circuit element comprises connecting first and second diode-connected transistors in series between the at least one bias current generator and a voltage reference.

17. The method of claim 16 wherein the first and second diode-connected transistors comprise N channel metal oxide semiconductor transistors.

* * * * *